United States Patent [19]

Endersz et al.

[11] 4,121,095
[45] Oct. 17, 1978

[54] OPTICAL RECEIVER

[75] Inventors: György Gezá Endersz, Älvsjö; Gunnar Stefan Forsberg, Stockholm, both of Sweden

[73] Assignee: Telefonaktiebolaget L M Ericsson, Stockholm, Sweden

[21] Appl. No.: 777,970

[22] Filed: Mar. 16, 1977

[30] Foreign Application Priority Data

Apr. 15, 1976 [SE] Sweden ............... 7604503

[51] Int. Cl.² .............. H03K 5/153; H04B 1/10; H04B 9/00
[52] U.S. Cl. ............... 250/199; 178/69 R; 325/13; 325/326; 328/164
[58] Field of Search ............ 250/199; 325/13, 326; 328/164; 178/69; 358/280

[56] References Cited

U.S. PATENT DOCUMENTS

| 2,981,796 | 4/1961 | DeLange | 325/13 |
| 3,278,684 | 10/1966 | Geraghty | 178/69 R |
| 3,509,279 | 4/1970 | Martin | 325/326 |
| 3,697,757 | 10/1972 | Stone | 250/199 |
| 3,716,780 | 2/1973 | Van Elk | 325/326 |
| 3,962,549 | 6/1976 | Zuk | 328/164 |
| 4,006,304 | 2/1977 | Sell | 250/199 |

Primary Examiner—Howard W. Britton
Attorney, Agent, or Firm—Hane, Roberts, Spiecens & Cohen

[57] ABSTRACT

Optical receiver arranged to provide a dispersion-compensated detection of digital information transferred by a light pulse train via a fibre optic conductor, includes a registering means and a timing regenerating means connected in parallel to the fibre optic conductor via an optoelectrical converter. The registering means has a sampling terminal, an activation input that is arranged for a short activation of the sampling contact and which is connected to the timing regenerating means, and an output that is arranged for reproducing the registered digital information transferred by the light pulse train. According to the invention, the optical receiver has a decision means with a decision level determining input supplied with a control voltage obtained from the output of the registering means via a digital-to-analog converting link and is interconnected between the optoelectrical converter and the sampling contact of the registering means.

1 Claim, 1 Drawing Figure

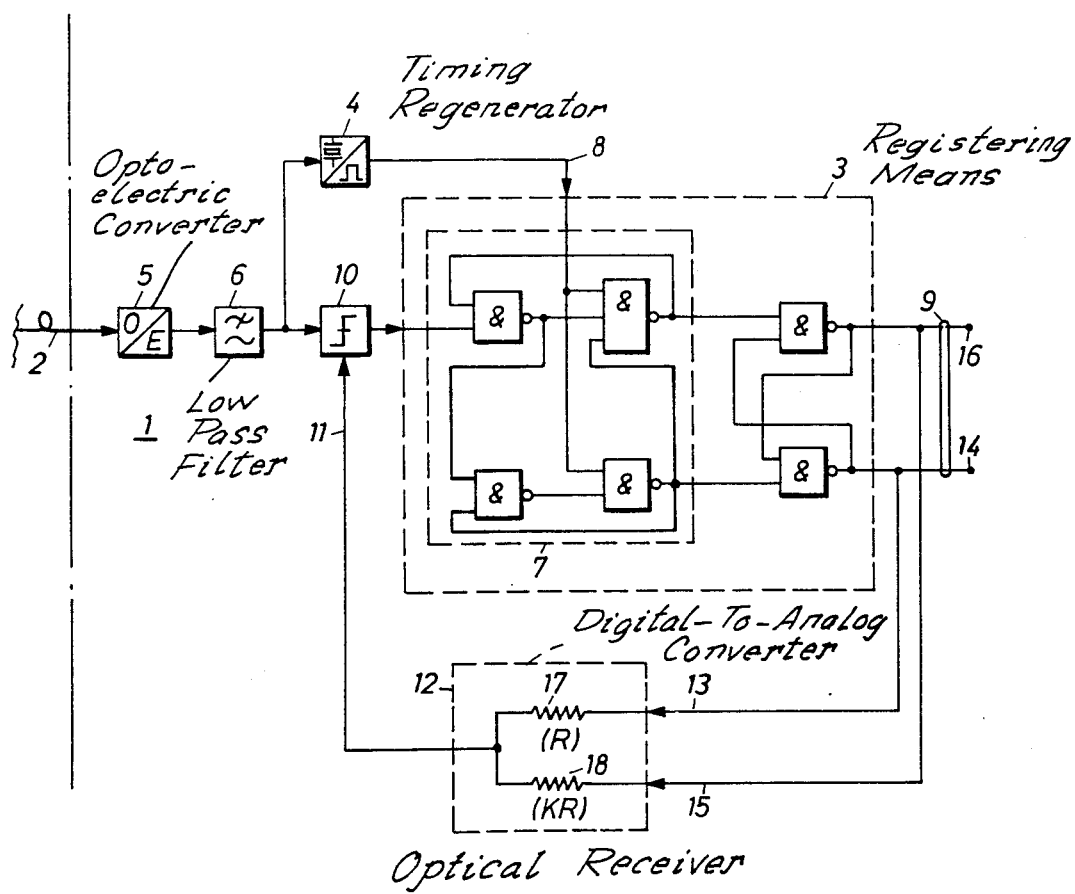

OPTICAL RECEIVER

The present invention relates to an optical receiver arranged to provide a dispersion-compensated detection of digital information transferred by a light pulse train via a fibre optic conductor.

A problem when detecting digital information transferred by a light pulse train via a fibre optic conductor is, besides the attenuation, that the pulses are broadened due to dispersion. When the pulse timing frequency is high, the transmission distance is limited due to the fact that the ulses will mutually overlap to such an extent that their individual detection is no longer possible.

The state of the art appears from an article regarding an optical transmission system for 100 Mbit/s published in Nachrichtentechn., Z.29 (1976) H.3, p. 249–255.

An object of the invention is to provide apparatus for a dispersion-compensated detection of digital information transferred by a light pulse train via a fibre optic conductor.

The invention whose characteristics appear from the appended claims will be described more in detail with reference to the accompanying drawing whose sole FIGURE shows a preferred embodiment of an optical receiver according to the invention.

The preferred embodiment of an optical receiver 1 according to the invention is arranged to provide a dispersion-compensated detection of digital information transferred by a light pulse train via a fibre optic conductor 2. The optical receiver 1 has a registering means 3 and a timing regenerating means 4 connected in parallel to a fibre optic conductor 2 via an optoelectrical converter 5 and a noise rejecting low-pass filter 6. The registering means 3 comprises a sampling terminal 7, an activation input 8 that is arranged for a short activation of the sampling terminal 7 and is connected to the timing regenerating means 4, and an output 9 that is arranged for reproducing the registered digital information transferred by the light pulse train.

According to the invention, the optical receiver 1 also includes a decision means 10 that has a decision level determining input 11 supplied with a control voltage obtained from the output 9 of the registering means 3 via a digital-to-analog converting link 12 and is interconnected between the optoelectrical converter 5 and the sampling terminal 7 of the registering means 3. According to the example, the digital-to-analog converting link 12 has a most significant input 13 connected to a non-inverting output 14 and a next most significant input 15 connected to an inverting output 16 of the output 9 of the registering means 3. Thus the control voltage supplied to the input 11 of the decision means 10 will vary between a maximum value and a minimum value in dependence whether or not a need of a dispersion-compensation exists as indicated by the registered digital information in the light pulse train.

It is assumed that adjacent pulses in the light pulse train mutually overlap due to dispersion to such a degree that a registering of a pulse as a binary one in the registering means 3 implies that the decision level for a registration of a pulse in the next pulse position in the light pulse train must be increased by a factor K in order to keep a constant margin against a wrong decision. According to the example a dispersion-compensation is achieved by the digital-to-analog converting link 12 which consists of a first resistor 17 with a resistance R and a second resistor 18 with a resistance KR arranged to connect its most significant input 13 and its next most significant input 15, respectively, to the input 11 of the decision means 10.

The dispersion-compensation may eventually take place with respect to several preceding pulse positions in the light pulse train, when a number of less significant inputs are fed to the digital-to-analog converting link 12 from suitable delay circuits connected to the output 9 of the registering means 3.

According to the example, the registering means 3 consists of an edge triggered D-type flip-flop of known construction in which a clock input forms the activation input 8 and a gate circuit, that is activated only during the leading edge of the clock pulse, forms said sampling terminal 7.

We claim:

1. An optical receiver for providing a dispersion-compensated detection of digital information transferred by a light pulse train via a fibre conductor, said device comprising:
a registering means and a timing regenerating means connected in parallel to the fibre conductor via an opto-electrical converter, said registering means including a sampling contact, an activation input for a short activation of the sampling contact and connected to said timing regenerating means, and an output for reproducing the registered digital information transferred by the light pulse train, decision means having a decision level determining input supplied with a control voltage obtained from the output of said registering means via a digital-to-analog converting link and being interconnected between the optoelectrical converter and the sampling contact of the registering means, said digital-to-analog converting link having a most significant input connected to a non-inverting pole and a next most significant input connected to an inverting pole of the registering means.

* * * * *